US005721437A

United States Patent [19]

Twynam et al.

[11] Patent Number: 5,721,437

[45] Date of Patent: Feb. 24, 1998

[54] HETEROJUNCTION-TYPE BIPOLAR TRANSISTOR WITH BALLAST RESISTANCE LAYER

[75] Inventors: John Kevin Twynam; Motoji Yagura; Toshiyuki Shinozaki, all of Tanri; Toshiaki Kinosada, Izumi, all of Japan

[73] Assignee: Sharp Kabushiki Kaisha, Osaka, Japan

[21] Appl. No.: 518,673

[22] Filed: Aug. 23, 1995

Related U.S. Application Data

[63] Continuation-in-part of Ser. No. 253,932, Jun. 3, 1994, abandoned.

[30] Foreign Application Priority Data

Jun. 8, 1993 [JP] Japan .................................. 5-137222

[51] Int. Cl.$^{6}$ .................... H01L 31/0328; H01L 31/0336

[52] U.S. Cl. ............................................ 257/197; 257/198

[58] Field of Search .................................. 257/197, 198, 257/12

[56] References Cited

U.S. PATENT DOCUMENTS 5,162,243 11/1992 Streit et al. .............................. 437/31

FOREIGN PATENT DOCUMENTS 0 297 886-A2 1/1989 European Pat. Off. .
0297886 1/1989 European Pat. Off. .
0 529 772-A1 3/1993 European Pat. Off. .
0 562 272-A2 9/1993 European Pat. Off. .
0562272 9/1993 European Pat. Off. .
4-233233 8/1992 Japan .

OTHER PUBLICATIONS

G. Gao, et al., "Emitter Ballasting Resistor Design for, and Current Handling Capability of, AlGaAs/GaAs Power Heterojunction Bipolar Transistors," 8093 *IEEE Transactions on Electron Devices*, vol. 38, No. 2, pp. 185–196 (Feb. ' 91), New York.

*Patent Abstracts of Japan*, vol. 15, No. 185 (E–1066), May 13, 1991, abstracting Itakura et al./Matsushita published app'n JP 3–046 334, published Feb. 13, 1991.

Translation of Fig. 3 of Okada.

*Primary Examiner*—Wael Fahmy
*Attorney, Agent, or Firm*—David G. Conlin; Milton Oliver

[57] ABSTRACT

A heterojunction type AlGaAs/GaAs bipolar transistor includes an n-GaAs collector layer, a $p^+$-GaAs base layer and an n-$Al_xGa_{1-x}As$ emitter layer formed in a stack, and an n-$Al_yGa_{1-y}As$ ballast resistance layer formed on the emitter layer. The ballast resistance layer has an Al concentration y in the range of $0<y<0.4$, and a resistance higher than that of the emitter layer.

11 Claims, 8 Drawing Sheets

F I G. 1
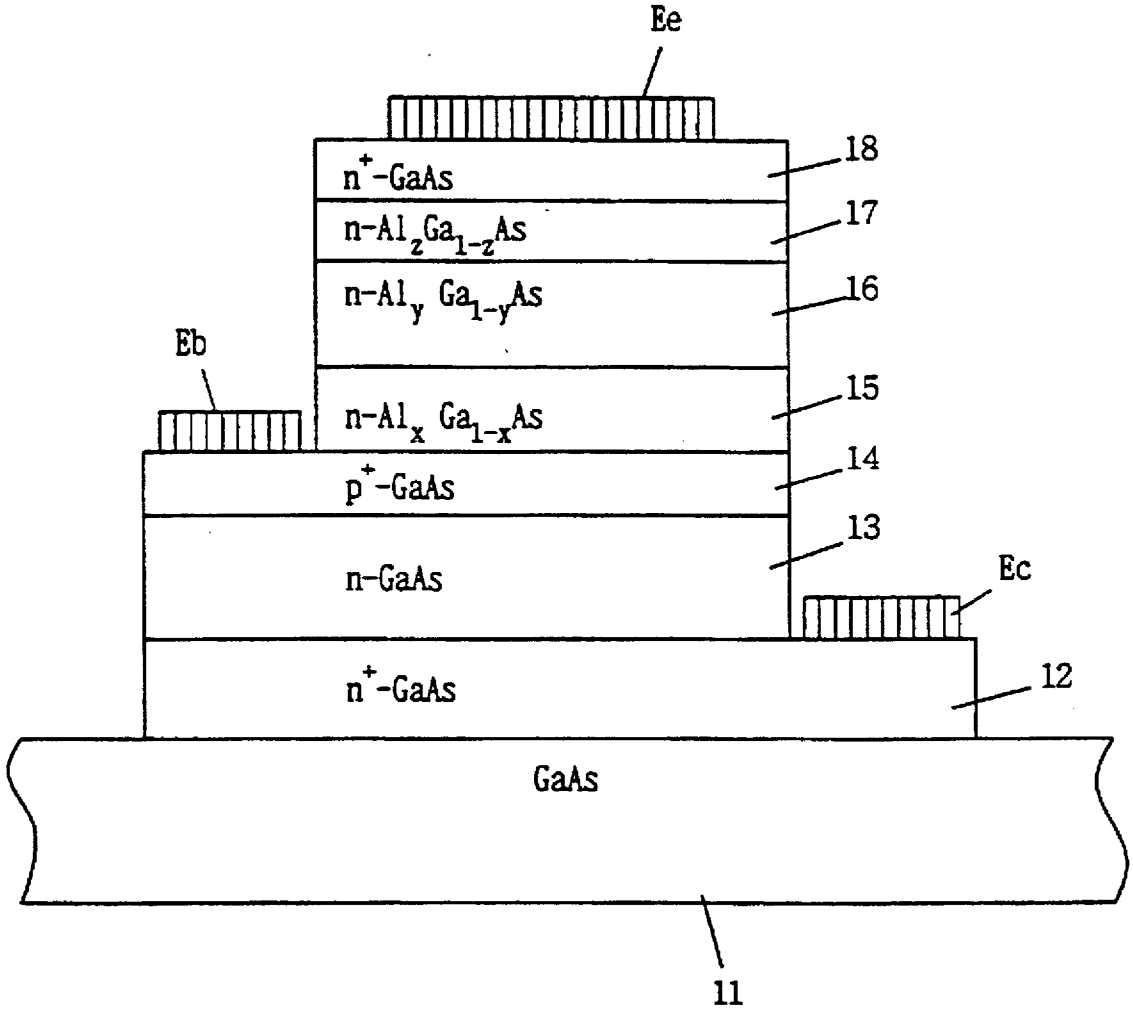

Calculated thermal coefficient of resistance vs Al mole fraction

HETEROJUNCTION-TYPE BIPOLAR TRANSISTOR WITH BALLAST RESISTANCE LAYER

RELATED APPLICATION

This application is a continuation-in-part of U.S. Ser. No. 08/253,932, filed Jun. 3, 1994 now abandoned.

BACKGROUND OF THE INVENTION

1. Field of the Invention

The present invention relates to heterojunction type bipolar transistors, and more particularly, to an improvement in a bipolar transistor having a ballast resistance.

2. Description of the Background Art

A conventional power control heterojunction type bipolar transistor is liable to extraordinarily generate heat when a control current is increased. The extraordinary heat generation is caused by a positive feedback: a transistor generates heat by a collector current at the time of operation, the collector current is increased by the heat generated, and the increased collector current further increases heat generation. In order to prevent such extraordinary heat generation, as is disclosed in Japanese Patent Laid-Open No. 3-46334, a heterojunction type bipolar transistor is known including, as a ballast resistance, a GaAs layer having the same conductivity type as that of an emitter layer and an impurity concentration lower than that of the emitter layer.

In FIG. 10, a heterojunction-type AlGaAs/GaAs bipolar transistor, as disclosed in Japanese Patent Laid-Open No. 3-46334, is schematically shown in section. In this transistor, an $n^+$-GaAs subcollector layer 82 is formed on a semi-insulating GaAs substrate 81. Subcollector layer 82 may have a thickness of 5000 Å and an n type carrier concentration of $n=5\times10^{18}$ $cm^{-3}$, for example. On subcollector layer 82, formed are an n-GaAs collector layer 83 and a collector electrode Ec. Collector layer 83 may have a thickness of 5000 Å and a carrier concentration of $n=5\times10^{16}$ $cm^{-3}$.

A $p^+$-GaAs base layer 84 is formed on collector layer 83. Base layer 84 may have a thickness of 700 Å and a p-type carrier concentration of $p=4\times10^{19}$ $cm^{-3}$. On base layer 84, formed are a base electrode Eb and an n-$Al_{0.3}Ga_{0.7}As$ emitter layer 85. Emitter layer 85 may have a thickness of 800 Å and a carrier concentration of $n=5\times10^{17}$ $cm^{-3}$.

An $n^-$-GaAs ballast resistance layer 86 is formed on emitter layer 85. Ballast resistance layer 86 may have a thickness of 2000 Å and a carrier concentration of $n=10^{16}$ $cm^{-3}$. On ballast resistance layer 86, sequentially stacked are an $n^+$-GaAs contact layer 87 and an emitter electrode Ee. Contact layer 87 may have a thickness of 1000 Å and a carrier concentration of $n=5\times10^{18}$ $cm^{-3}$.

FIG. 11 schematically shows an energy band structure corresponding to the sectional structure of the transistor of FIG. 10. In FIGS. 11 and 10, the same or corresponding portions are labeled with the same reference characters. In the energy band structure of FIG. 11, a base/emitter voltage $V_{BE}$ is applied between base layer 84 and contact layer 87, and a collector/emitter voltage $V_{CE}$ is applied between subcollector layer 82 and contact layer 87. A Γ valley and an L valley having an energy level higher than the Γ valley are shown as conduction bands. As described above, in order to prevent extraordinary heat generation of the heterojunction type AlGaAs/GaAs bipolar transistor, a GaAs layer is usually used as a ballast resistance having the same conductivity type as that of the emitter layer and a carrier concentration lower than that of the emitter layer.

In order to operate the heterojunction type AlGaAs/GaAs bipolar transistor stably, it is necessary to block a positive feedback causing extraordinary heat generation. To do so, it is necessary to prevent increase in a collector current caused by a rise of temperature of the transistor. In order to prevent such increase in a collector current by a rise of temperature, a ballast resistance as described above is used. Since the ballast resistance also serves as a parasitic resistance of the transistor, however, the ballast resistance degrades the characteristics of the bipolar transistor.

Therefore, it is desired to have a ballast resistance having a low resistance value in a normal operative state where the temperature of the transistor is low, and having a high resistance value in a state of extraordinary heat generation where the temperature of the transistor is high. In other words, a ballast resistance having a large temperature coefficient of a resistance value is desired. However, the conventionally used GaAs ballast resistance layer has a relatively small temperature coefficient of approximately 0.001° $C.^{-1}$.

SUMMARY OF THE INVENTION

In view of the background art as described above, one object of the present invention is to provide a heterojunction type bipolar transistor having a ballast resistance of an excellent characteristic.

The heterojunction type AlGaAs/GaAs bipolar transistor according to the present invention includes an n-GaAs collector layer, a $p^+$-GaAs base layer and an n-$Al_xGa_{1-x}As$ emitter layer sequentially stacked, and an n-$Al_yGa_{1-y}As$ ballast resistance layer formed on the emitter layer, wherein the ballast resistance layer has an Al concentration y in the range of 0<y<0.4 and a resistance higher than that of the emitter layer.

In the AlGaAs/GaAs bipolar transistor according to the present invention, the n-$Al_yGa_{1-y}As$ ballast resistance layer has a positive temperature coefficient $(dR/dT)\times(1/R)$ larger than that of the $n^-$-GaAs ballast resistance layer, wherein R is a resistance and T is a temperature. In the n-$Al_yGa_{1-y}As$ ballast resistance layer, by selecting the Al concentration y, the energy gap between valleys of a conduction band can be adjusted. When the energy gap between valleys is small, more electrons are thermally excited on the upper valley with increase in the temperature. Effective mass of electrons increases, and mobility of the electrons decreases, resulting in increase in resistance of the n-$Al_yGa_{1-y}As$ ballast resistance layer.

More specifically, the n-$Al_yGa_{1-y}As$ ballast resistance layer has a substantially larger resistance in high temperature as compared to the conventional $n^-$-GaAs ballast resistance layer. Therefore, it is possible to more reliably prevent extraordinary heat generation caused by a positive feedback of the collector current in high temperature, making it possible to implement thermally stable operation of the bipolar transistor.

The foregoing and other objects, features, aspects and advantages of the present invention will become more apparent from the following detailed description of the present invention when taken in conjunction with the accompanying drawings.

BRIEF DESCRIPTION OF DRAWINGS

FIG. 1 is a schematic sectional view showing an AlGaAs/GaAs bipolar transistor according to one embodiment of the present invention.

DESCRIPTION OF THE PREFERRED EMBODIMENTS

Figure 2:
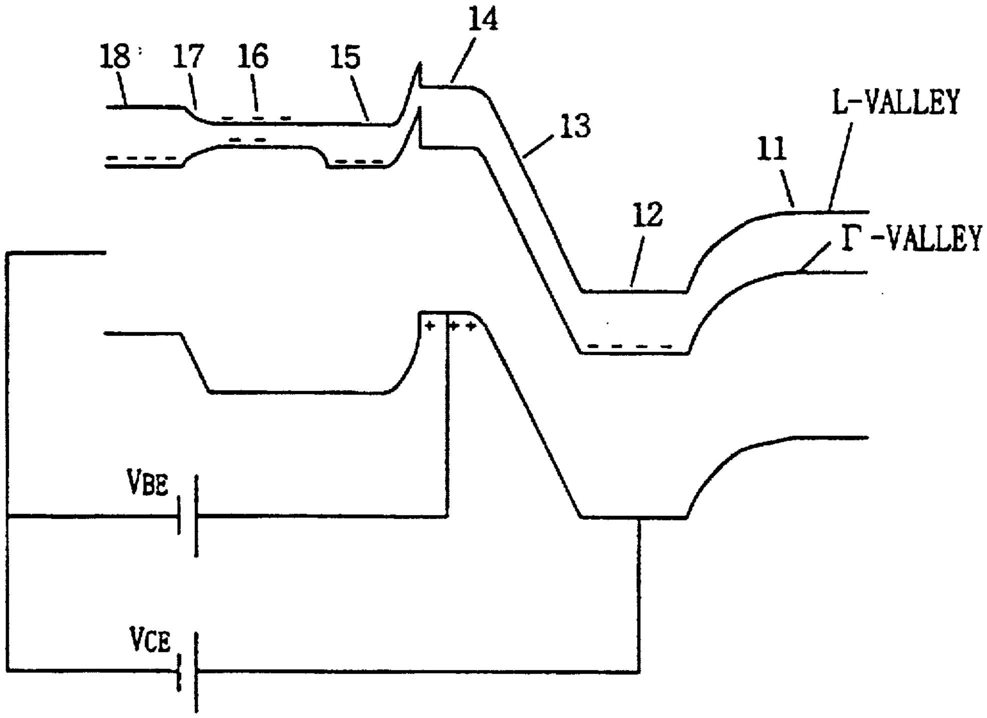
FIG. 2 is a diagram showing an energy band structure corresponding to the sectional structure of the transistor of FIG. 1.

FIG. 1 schematically shows a sectional structure of a heterojunction-type AlGaAs/GaAs bipolar transistor according to one embodiment of the present invention. In this transistor, on a semi-insulating GaAs substrate 11, formed is an $n^+$-GaAs subcollector layer 12. Subcollector layer 12 may have a thickness of 5000 Å and an n type carrier concentration of $n=5\times10^{18}$ $cm^{-3}$, for example. On subcollector layer 12, formed are an n-GaAs collector layer 13 and a collector electrode Ec. Collector layer 13 may have a thickness of 5000 Å and a carrier concentration of $n=5\times10^{16}$ $cm^{-3}$.

On collector layer 13, formed is a $p^+$-GaAs base layer 14. Base layer 14 may have a thickness of 700 Å and a p type carrier concentration of $p=4\times10^{19}$ $cm^{-3}$.

On base layer 14, formed is an n-$Al_xGa_{1-x}As$ emitter layer 15. Emitter layer 15 preferably has an Al concentration of x=0.3. Emitter layer 15 may have a thickness of 800 Å and a carrier concentration of $n=5\times10^{17}$ $cm^{-3}$.

An n-$Al_yGa_{1-y}As$ ballast resistance layer 16 is formed on emitter layer 15. Ballast resistance layer 16 preferably has an Al concentration of y=0.35. Ballast resistance layer 16 may have a thickness of 2000 Å and a carrier concentration of $n=10^{17}$ $cm^{-3}$.

An n-$Al_zGa_{1-z}As$ graded layer 17 is formed on ballast resistance layer 16. Graded layer 17 may have a thickness of 500 Å and a carrier concentration of $n=10^{18}$ $cm^{-3}$. On graded layer 17, formed is an $n^+$-GaAs contact layer 18 to be connected to the emitter electrode Ee. Contact layer 18 may have a thickness of 1000 Å and a carrier concentration of $n=5\times10^{18}$ $cm^{-3}$.

Ballast resistance layer 16 has a resistance higher than that of emitter layer 15. The resistance of ballast resistance layer 16 can be increased by lowering the carrier concentration as compared to emitter layer 15. The resistance of ballast resistance layer 16 can be increased, however, by increasing the Al concentration y a little. The carrier concentration does not necessarily have to be lowered. More specifically, ballast resistance layer 16 must have a resistance higher than that of emitter layer 15, but the carrier concentration in the ballast resistance layer does not necessarily have to be lowered as compared to the emitter layer.

Graded layer 17 is provided to reduce discontinuity in the energy band between ballast resistance layer 16 and contact layer 18. Therefore, the Al concentration z in graded layer 17 is gradually changed from z=y on the side in contact with ballast resistance layer 16 to z=0 on the side in contact with contact layer 18. The Al concentration z may be changed in a linear, curved or stepped manner. Although graded layer 17 is preferably provided to reduce discontinuity in the energy band between ballast resistance layer 16 and contact layer 18 as described above, it is not necessarily required.

The heterojunction type AlGaAs/GaAs bipolar transistor as shown in FIG. 1 can be formed with well-known methods, an MOCVD (Metal Organic Chemical Vapor Deposition) method and a mesa etching method. Silicon can be used as an n-type dopant, and carbon can be used as a p-type dopant.

Figure 11:
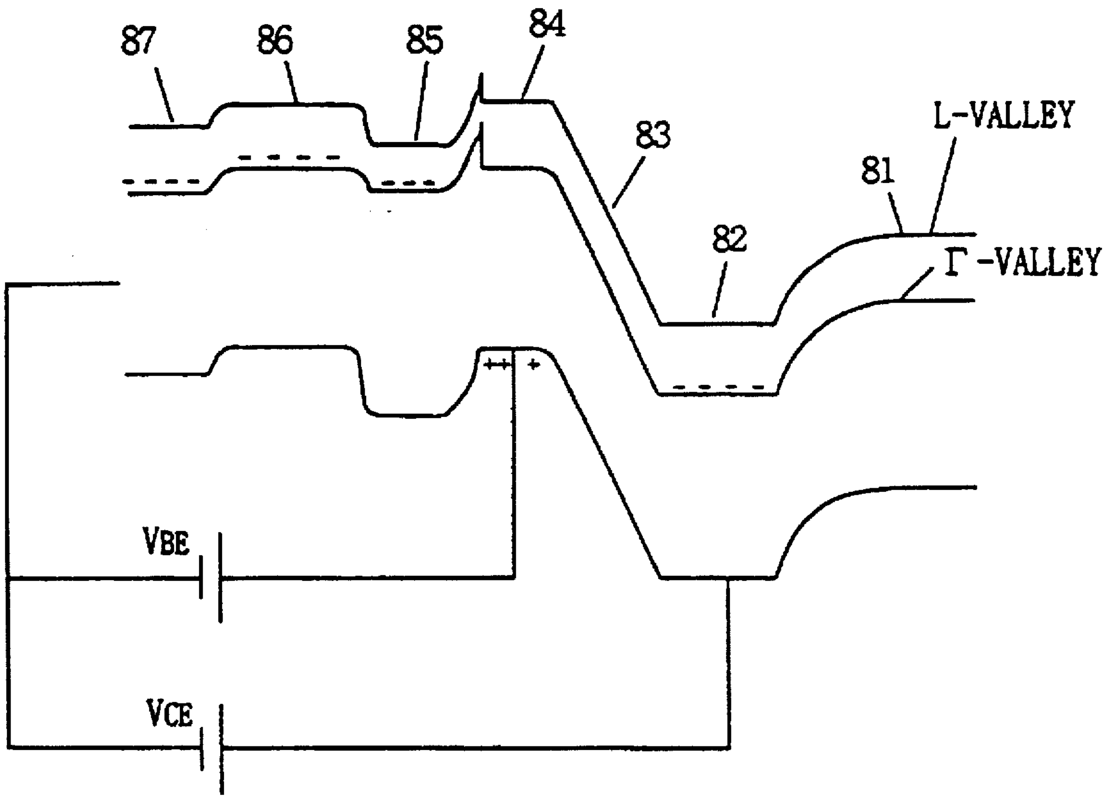
FIG. 11 is a diagram showing an energy band structure corresponding to the sectional structure of FIG. 10.

FIG. 2 shows an energy band profile corresponding to the sectional structure of such a transistor as shown in FIG. 1. In FIG. 2, the base/emitter voltage $V_{BE}$ is applied between base layer 14 and contact layer 18, and the collector/emitter voltage $V_{CE}$ is applied between subcollector layer 12 and contact layer 18. A Γ valley and an L valley having an energy level higher than that of the Γ valley are shown as conduction bands. In comparison of FIGS. 2 and 11, energy levels of the Γ valley and the L valley in n-$Al_yGa_{1-y}As$ ballast resistance layer 16 are more closely adjacent to each other as compared in an $n^-$-GaAs ballast resistance layer 86. Therefore, as compared to the case of $n^-$-GaAs ballast resistance layer 86, electrons are more easily excited from the Γ valley at a lower level to the L valley at a higher level with increase in temperature in n-$Al_yGa_{1-y}As$ ballast resistance layer 16. It is understood that because of reduction of mobility due to increase in effective mass of excited electrons, n-$Al_yGa_{1-y}As$ ballast resistance layer 16 has a rapid increase in resistance with rise of temperature as compared to $n^-$-GaAs ballast resistance layer 86.

Figure 3:
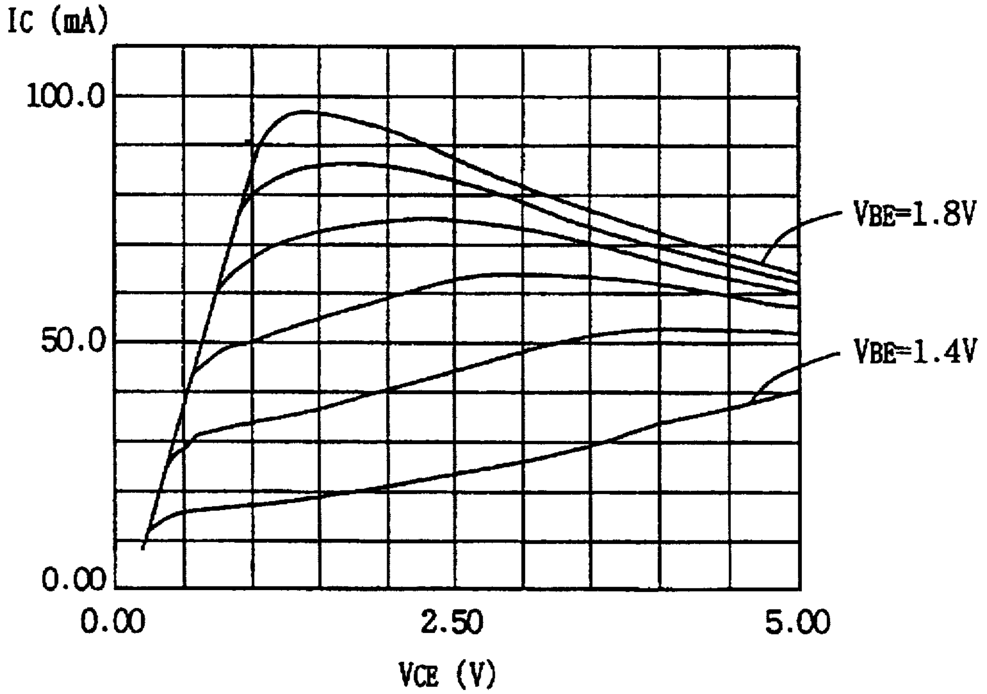
FIG. 3 is a graph showing $I_C$–$V_{CE}$ characteristics in such a transistor as shown in FIG. 1.

FIG. 3 is a graph showing characteristics of such a transistor as shown in FIG. 1. The abscissa denotes the collector/emitter voltage $V_{CE}$, and the ordinate denotes the collector current $I_C$ (mA). In FIG. 3, n-$Al_xGa_{1-x}As$ emitter layer 15 has an Al concentration of x=0.3, and n-$Al_yGa_{1-y}As$ ballast resistance layer 16 has an Al concentration of y=0.35. Various curves in FIG. 3 show $I_C$–$V_{CE}$ characteristics of the transistor under various base/emitter voltages $V_{BE}$. More specifically, in a region where the collector/emitter voltage $V_{CE}$ is relatively low, the collector current $I_C$ increases in proportion to $V_{CE}$. However, when the collector/emitter voltage $V_{CE}$ exceeds a certain level, the collector current $I_C$ or the rate of increase of the collector current decreases, and extraordinary heat generation of the transistor is prevented.

Figure 4:
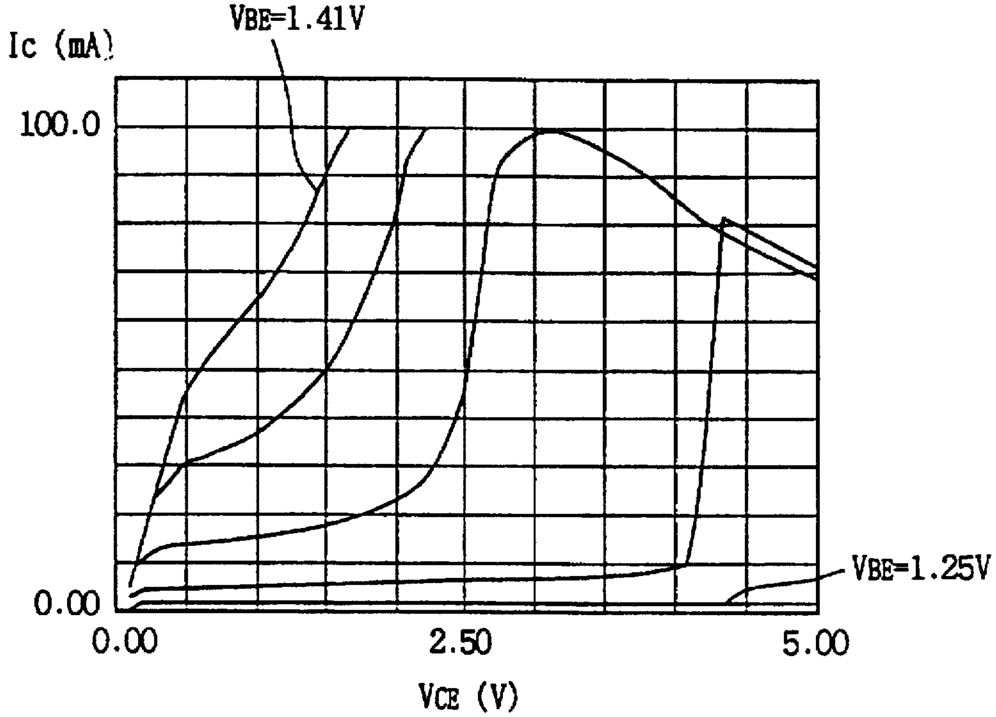
FIG. 4 is a graph showing the $I_C$–$V_{CE}$ characteristics in a conventional transistor not including a ballast resistance layer.

FIG. 4 is a graph similar to that of FIG. 3, showing the $I_C$–$V_{CE}$ characteristics in the AlGaAs/GaAs bipolar transistor not including ballast resistance layer 16. In the transistor shown in FIG. 4, the collector current I rapidly increases with increase in the collector/emitter voltage $V_{CE}$. It is understood that the transistor has unstable characteristics. In FIG. 4, two curves terminate at $I_C$=100.0 mA. This is because a protecting circuit of the measurement device worked at that collector current value. Two other curves show decrease in collector current at high voltage $V_{CE}$. This is due to base current limiting protection circuitry in the measurement device. As is clear from the above, the heterojunction type bipolar transistor not having a ballast resistance layer is likely to generate extraordinary heat due to structural non-uniformity. In particular, it is difficult to obtain thermally stable characteristics without ballast resistance in a transistor having a plurality of emitter electrodes in a shape of finger.

According to the analysis of the inventors, an n-$Al_yGa_{1-y}As$ ballast resistance layer may have a temperature coefficient larger than that of a conventional $n^-$-GaAs ballast resistance layer in a region of a temperature up to approximately 500 K where an AlGaAs/GaAs bipolar transistor is usually used. The n-$Al_yGa_{1-y}As$ ballast resistance layer may have a temperature coefficient approximately ten times larger than that of the $n^-$-GaAs ballast resistance layer at approximately 350 K. The Al concentration y in the n-$Al_yGa_{1-y}As$ ballast resistance layer has only to be in the range of $0<y<0.4$, more preferably in the range of $0.15<y<0.4$, and the most preferably y=0.35. Description of the reason therefor will be given hereinafter.

Figure 5:
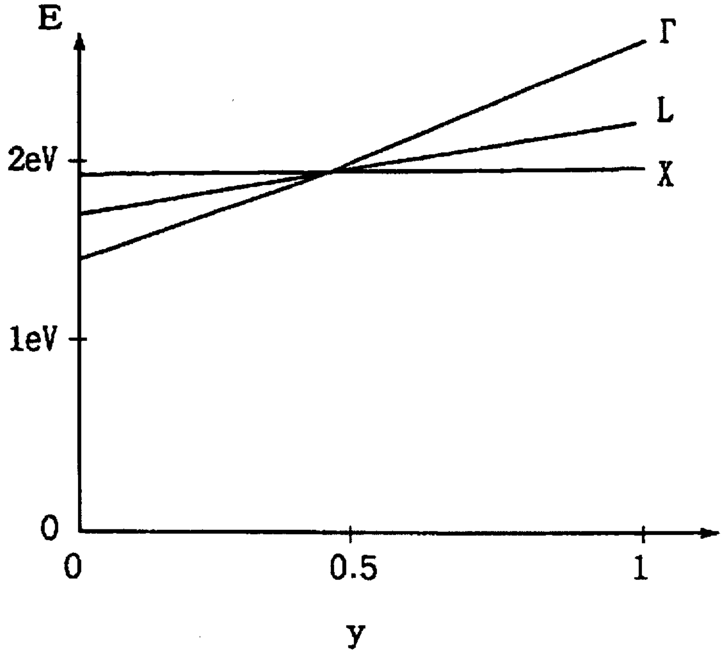
FIG. 5 is a graph showing an energy gap between a conduction band and a valence band depending on an Al concentration y in n-$Al_yGa_{1-y}As$.

In the graph of FIG. 5, shown is change of energy levels of three kinds of conduction bands of the Γ valley, the L valley and the X valley in n-$Al_yGa_{1-y}As$ ballast resistance layer 16. The abscissa represents the Al concentration y in the n-$Al_yGa_{1-y}As$ ballast resistance layer, and the between represents an energy difference E between the top of a valence band and the bottom of three kinds of conduction bands. When the Al concentration y is in the range of $0<y<0.4$, the energy level of the Γ valley is lower than those of the L valley and the X valley. As the Al concentration y approaches 0.4, the energy difference between valleys becomes small. More specifically, at certain electron concentration and temperature, it becomes easier to excite electrons from the Γ valley to a valley at a higher level as the Al concentration y increases. As a result, the ballast resistance rapidly increases. However, if the Al concentration y exceeds 0.4, there is no energy difference between valleys and the ballast resistance will not increase.

Figure 6:
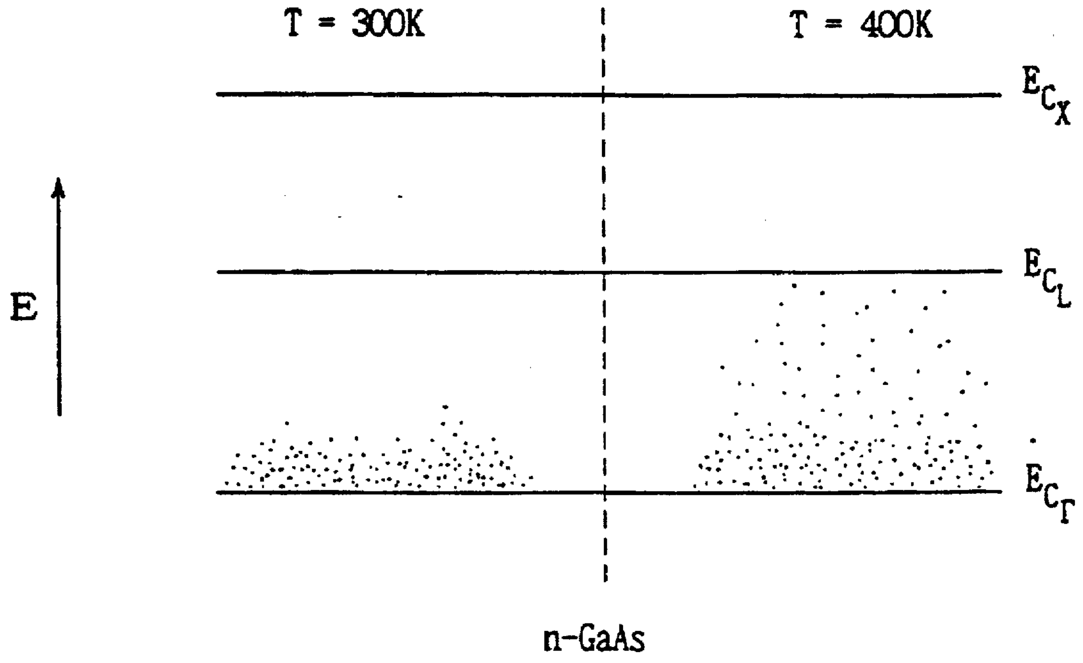
FIG. 6 is a diagram of an energy band showing electron distribution in n-GaAs at 300° K and 400° K.

FIG. 6 schematically shows a state of distribution of electrons in $n^-$-GaAs ballast resistance layer 86. At the temperature of 300 K, all the electrons are distributed in a lower region of the Γ valley $E_{C\Gamma}$, and no electrons are distributed in the L valley $E_{CL}$ and the X valley $E_{CX}$. Even at the temperature of 400 K, most electrons are distributed in the Γ valley.

Figure 7:
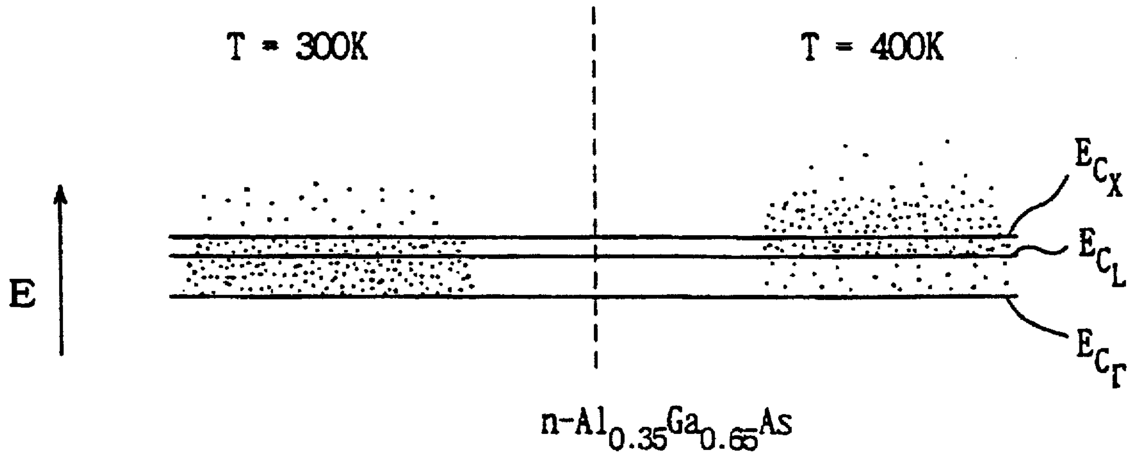
FIG. 7 is a diagram of an energy band showing electron distribution in n-$Al_{0.35}Ga_{0.65}As$ at 300° K and 400° K.

FIG. 7 is a diagram similar to that of FIG. 6, showing a state of distribution of electrons in n-$Al_{0.35}Ga_{0.65}As$ ballast resistance layer 16. In FIG. 7, as compared to the case of FIG. 6, the energy gap between valleys is substantially reduced. Therefore, even at the temperature of 300° K, electrons are not distributed only in the Γ valley. Thermally excited electrons are also distributed in the L valley and the X valley. At the temperature of 400° K, electrons are greater in number in the L valley and the X valley than in the Γ valley. The effective mass of electrons is greater in the L valley and the X valley than in Γ valley, and the average mobility of electrons excited in the Γ valley and the X valley is reduced. As a result, the resistance of n-$Al_{0.35}Ga_{0.65}As$ ballast resistance layer 16 rapidly increases.

Figure 8:
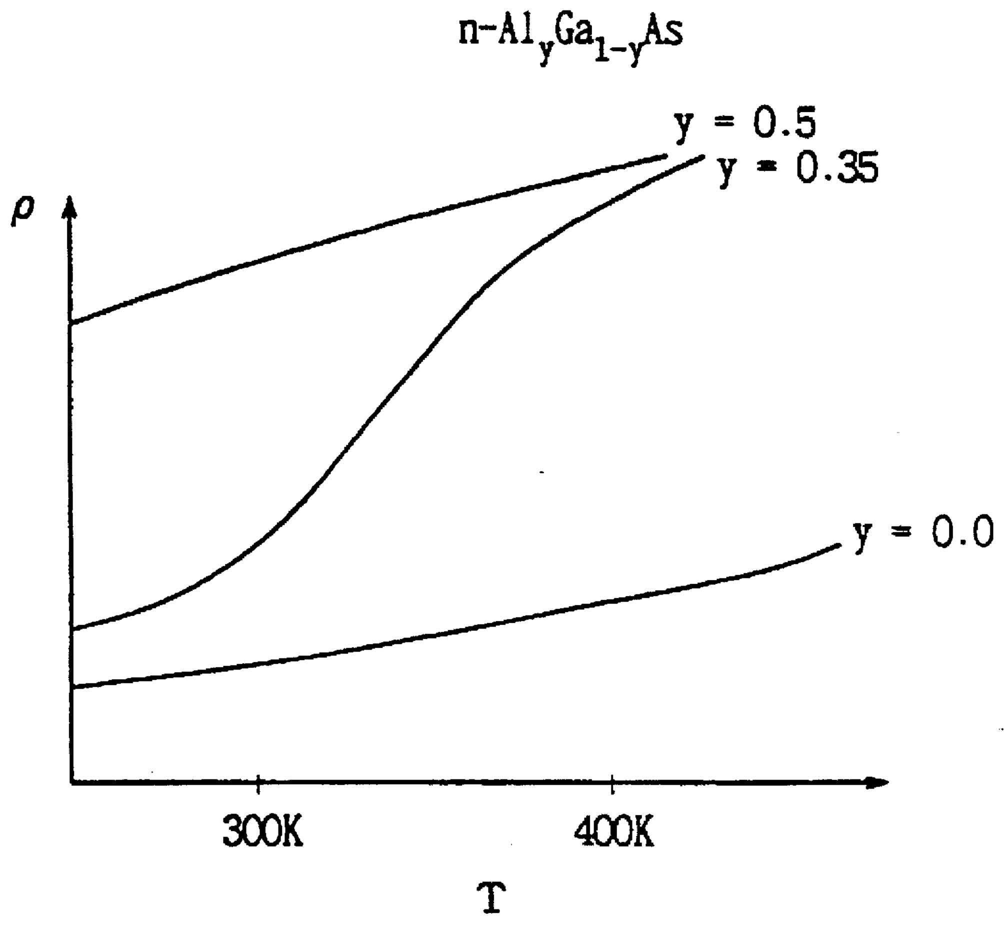
FIG. 8 is a graph showing an influence of the Al concentration y in n-$Al_yGa_{1-y}As$ on the relationship between temperature and resistivity.

In the graph of FIG. 8, the relationship between temperature T and resistivity ρ in n-$Al_yGa_{1-y}As$ is schematically shown. The abscissa represents the temperature T, and the ordinate represents the resistivity ρ. As is clear from FIG. 8, when the Al concentration is y=0.0, the resistivity ρ in a region of a low temperature has a small value. Even if the temperature rises, the resistivity ρ does not increase so much. When the Al concentration is y=0.35, the resistivity ρ in a region of a low temperature has a small value. However, the resistivity ρ rapidly increases with a rise of the temperature. When the Al concentration is y=0.5, the resistivity ρ has a relatively large value even in a region of a low temperature. The resistivity does not increase so much even if the temperature rises.

The ideal $Al_yGa_{1-y}As$ composition for the ballast layer depends upon the temperature of operation of the transistor. Since the environment in which the power transistor is operated can vary widely, the ambient or base-plate temperature of the power transistor can also vary widely. Under extreme conditions, the ambient temperature could be as low as 200° K or the transistor junction temperature as high as 450° K. Hence, it is necessary to have optimum $Al_yGa_{1-y}As$ compositions for temperatures in the range 200° K–450° K.

Figure 9:
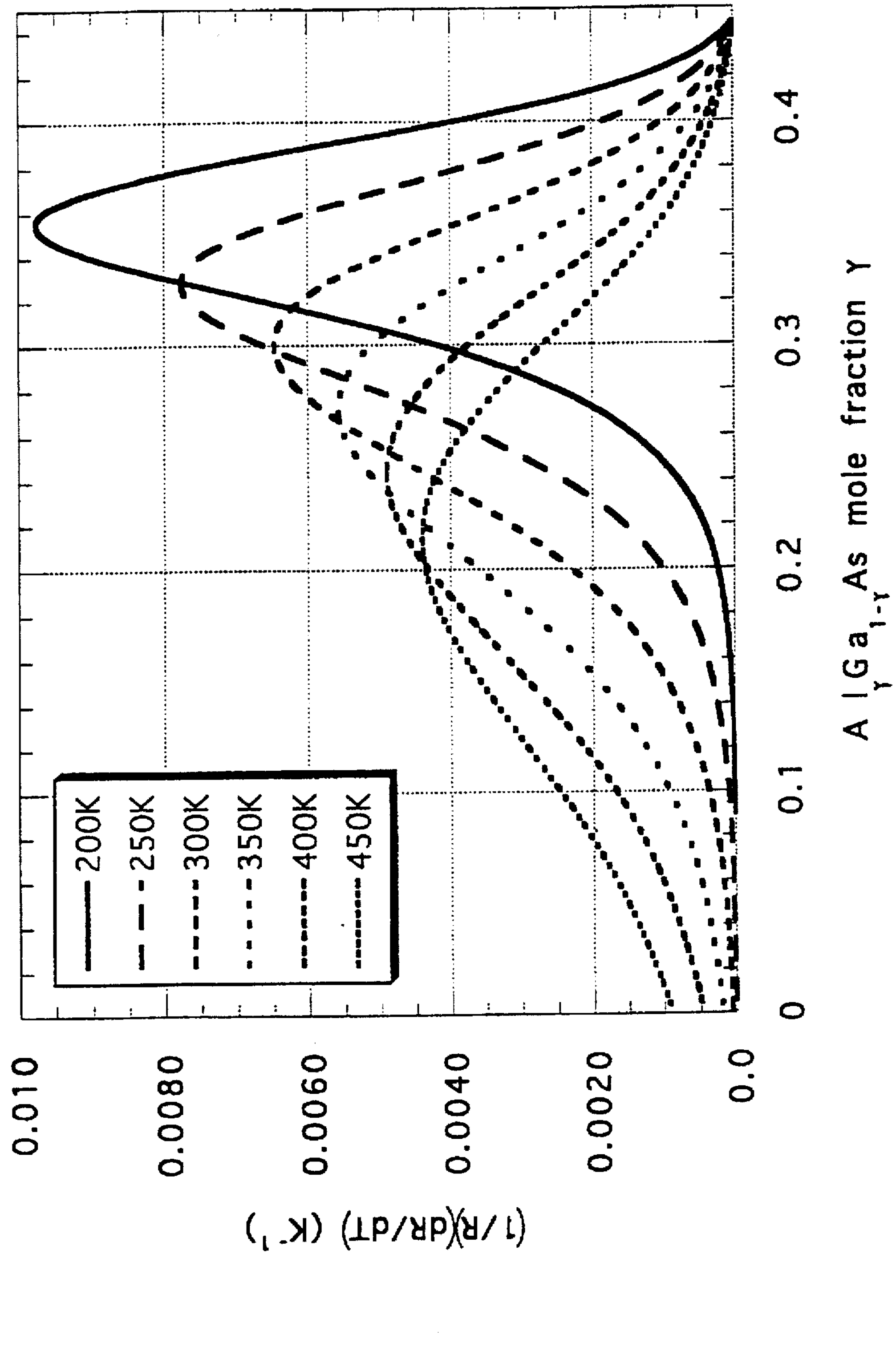
FIG. 9 is a graph showing an influence of the Al concentration y in n-$Al_yGa_{1-y}As$ on the relationship between a temperature coefficient of resistance and a temperature.
Figure 10:
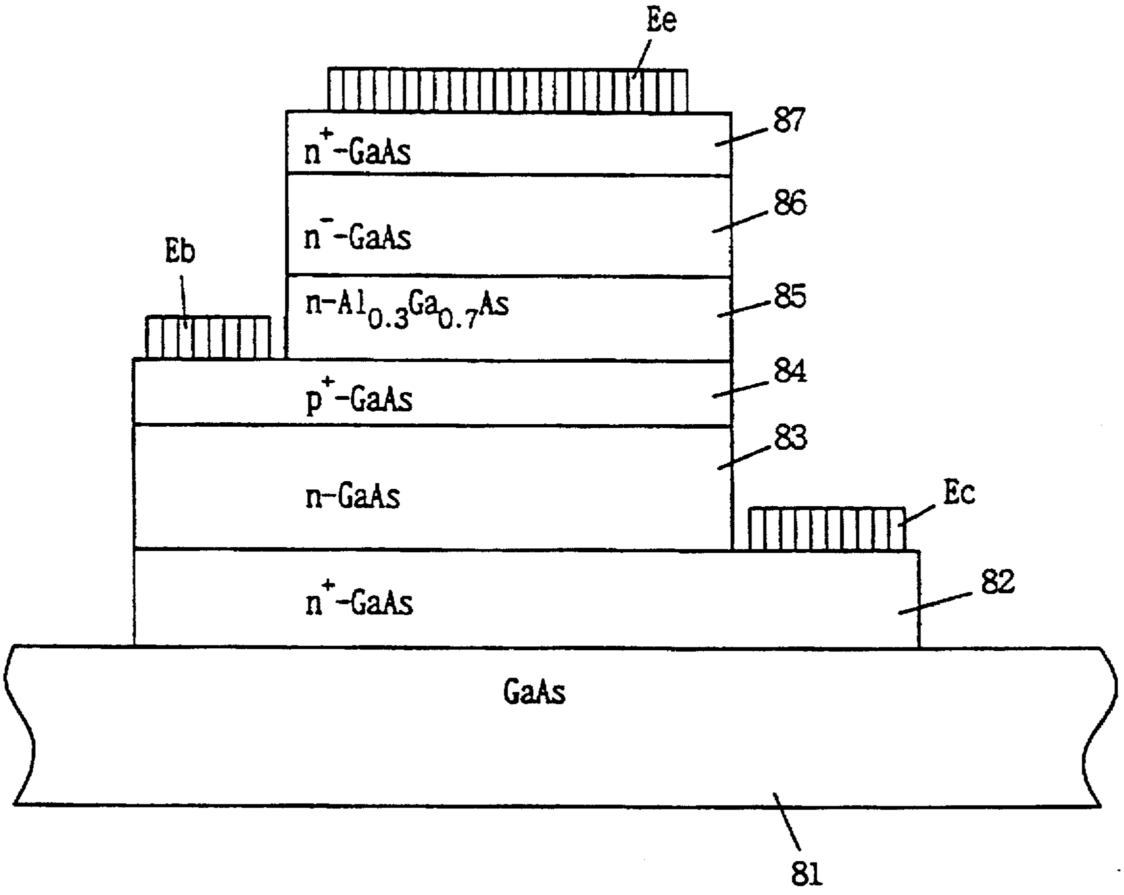
FIG. 10 is a schematic sectional view showing a conventional AlGaAs/GaAs bipolar transistor including a ballast resistance layer.

The composition of the $Al_yGa_{1-y}As$ can be considered optimal for a given junction temperature if the thermal coefficient of resistance (1/R) (dR/dT) is maximized at that temperature. The resistance of the ballast layer is dependent on the electron populations in the Γ, L and X valleys and on the electron mobility in each valley. The fraction of conduction band electrons in the Γ valley is approximately given by $$n(\Gamma)/n(\text{total})=[1+4(m_L/m_\Gamma)^{3/2}\exp((EG_\Gamma-EG_L)/kT)+6(m_X/m_\Gamma)^{3/2}\exp((EG_\Gamma-EG_X)/kT)]^{-1}$$

where m, $m_L$ and $m_X$ are the electron effective masses in each valley and $EG_\Gamma$, $EG_L$ and $EG_X$ are the energy bandgaps for each valley. Using this and similar expressions for the electrons in the L and X valleys, and assuming that the mobility in each valley is inversely proportional to the electron effective mass, the thermal coefficient of resistance (1/R) (dR/dT) can be calculated. In FIG. 9, the calculated thermal coefficient of resistance (1/R)(dR/dT) is plotted against Al mole fraction y, for junction temperatures of 200° K–450° K. The band structure and effective mass data for this calculation were taken from S. Adachi, *J. Appl. Phys.* 58 (3), pp. R1–R29, 1985. From FIG. 9, it can be seen that the optimum ballast layer Al mole fraction is always within the range $0.15<y<0.4$ for reasonable junction temperatures.

In selecting the Al concentration y in n-$Al_yGa_{1-y}As$ ballast resistance layer 16, the Al concentration y does not have to be constant in the direction of thickness of ballast resistance layer 16. The Al concentration y may be changed if desired.

As described above, in the heterojunction type AlGaAs/GaAs bipolar transistor according to the present invention, the n-$Al_yGa_{1-y}As$ ballast resistance layer has a preferably low resistance in a region of a low temperature, and has a sufficiently high resistance in a state of high temperature. Therefore, non-uniform current distribution in the transistor can be prevented. As a result, an AlGaAs/GaAs bipolar transistor of high reliability can be obtained which can implement thermally stable operation by having a low parasitic resistance in a state of low temperature, and by preventing extraordinary heat generation in a state of high temperature.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A heterojunction-type AlGaAs/GaAs bipolar transistor, comprising an n-GaAs collector layer, a $p^+$-GaAs base layer, and an n-$Al_xGa_{1-x}As$ emitter layer, stacked sequentially; and an n-$Al_yGa_{1-y}As$ ballast resistance layer formed on said emitter layer, wherein said ballast resistance layer has an Al concentration y varying within the range of $0.15<y<0.4$, and a resistance higher than that of said emitter layer.

2. The bipolar transistor as recited in claim 1, wherein an Al concentration x in said emitter layer is 0.3.

3. The bipolar transistor as recited in claim 1, wherein said collector layer is formed on an $n^+$-GaAs subcollector layer to be connected to a collector electrode.

4. The bipolar transistor as recited in claim 1, wherein the ballast resistance layer has a carrier density less than $1\times10^{17}$ $cm^{-3}$.

5. A heterojunction-type AlGaAs/GaAs bipolar transistor, comprising an n-GaAs collector layer, a $p^+$-GaAs base layer, defining a junction therebetween, and an n-$Al_xGa_{1-x}As$ emitter layer stacked sequentially; and an n-$Al_yGa_{1-y}As$ ballast resistance layer formed on said emitter layer, wherein said ballast resistance layer has an Al concentration y varying within the range of $0.15<y<0.4$, and a resistance higher than that of said emitter layer, and wherein the Al concentration y in said ballast resistance layer is graded along a direction perpendicular to a plane of said junction.

6. A heterojunction-type AlGaAs/GaAs bipolar transistor, comprising an n-GaAs collector layer, a $p^+$-GaAs base layer, and an n-$Al_xGa^{1-x}As$ emitter layer, stacked sequentially;

an n-$Al_yGa_{1-y}As$ ballast resistance layer formed on said emitter layer, wherein said ballast resistance layer has an Al concentration y varying within the range of $0.15<y<0.4$, and a resistance higher than that of said emitter layer, and an n-$Al_zGa_{1-z}As$ graded layer formed on said ballast resistance layer; and an n+-GaAs contact layer, formed on said graded layer, to be connected to an emitter electrode, wherein an Al concentration z in said graded layer gradually changes from z=y, on a side in contact with said ballast resistance layer, to z=0, on a side in contact with said contact layer.

7. The bipolar transistor as recited in claim 6, wherein said ballast resistance layer has a carrier concentration lower than those of said emitter layer and said graded layer.

8. A heterojunction-type AlGaAs/GaAs bipolar transistor, comprising an n-GaAs collector layer, a $p^+$-GaAs base layer, and an n-$Al_xGa_{1-x}As$ emitter layer, stacked sequentially; and an n-$Al_yGa_{1-y}As$ ballast resistance layer formed on said emitter layer, wherein said ballast resistance layer has a constant Al concentration y selected to be in the range of $0.15<y<0.4$, and a resistance higher than that of said emitter layer.

9. The bipolar transistor as recited in claim 8, wherein the Al concentration y in said ballast resistance layer is selected to be within the range $0.2<y\leqq0.35$.

10. The bipolar transistor as recited in claim 8, wherein the Al concentration y in said ballast resistance layer is 0.35.

11. The bipolar transistor as recited in claim 8, wherein the ballast resistance layer has a carrier density less than $1\times10^{17}$ $cm^{-3}$.

* * * * *